United States Patent [19]

Abe

[11] Patent Number: 5,034,889

[45] Date of Patent: Jul. 23, 1991

[54] DIAGNOSIS SYSTEM FOR A MOTOR VEHICLE

[75] Inventor: Kunihiro Abe, Higoshimuroyama, Japan

[73] Assignee: Fuji Jukogyo Kabushiki Kaisha, Tokyo, Japan

[21] Appl. No.: 327,518

[22] Filed: Mar. 21, 1989

[30] Foreign Application Priority Data

Mar. 29, 1988 [JP] Japan .................................. 63-077642

[51] Int. Cl.$^5$ ........................ G06F 11/30; G06F 15/74
[52] U.S. Cl. .............................. 364/424.04; 73/117.3; 364/424.03
[58] Field of Search ...................... 364/424.03, 424.04, 364/431.01, 424.01; 307/9.1, 10.1; 73/117.2, 117.3

[56] References Cited

U.S. PATENT DOCUMENTS

| | | | |
|---|---|---|---|
| 4,694,408 | 9/1987 | Zaleski | 364/424.03 |
| 4,748,843 | 6/1988 | Schäfer et al. | 73/117.3 |
| 4,757,463 | 7/1988 | Ballou et al. | 364/551.01 |
| 4,760,275 | 7/1988 | Sato et al. | 307/10.1 |
| 4,787,041 | 11/1988 | Yount | 364/424.03 |
| 4,796,206 | 1/1989 | Boscove et al. | 364/551.01 |

FOREIGN PATENT DOCUMENTS 60-25974 2/1985 Japan .

Primary Examiner—Thomas G. Black
Attorney, Agent, or Firm—Martin A. Farber

[57] ABSTRACT

A system for diagnosing electronic control systems mounted in a motor vehicle has a signal receiver for receiving a data demand signal from a diagnosis device, an interpreter for interpreting a content of the received data demand signal and a signal transmitter for transmitting an output signal to the diagnosis device in accordance with the interpretation. A signal receiving line connects all of the signal receivers with each other in parallel, and a signal transmitting line connects all of the signal transmitters with each other in parallel. The signal receiving line and signal transmitting line are connected with the diagnosis device by a connector.

8 Claims, 9 Drawing Sheets

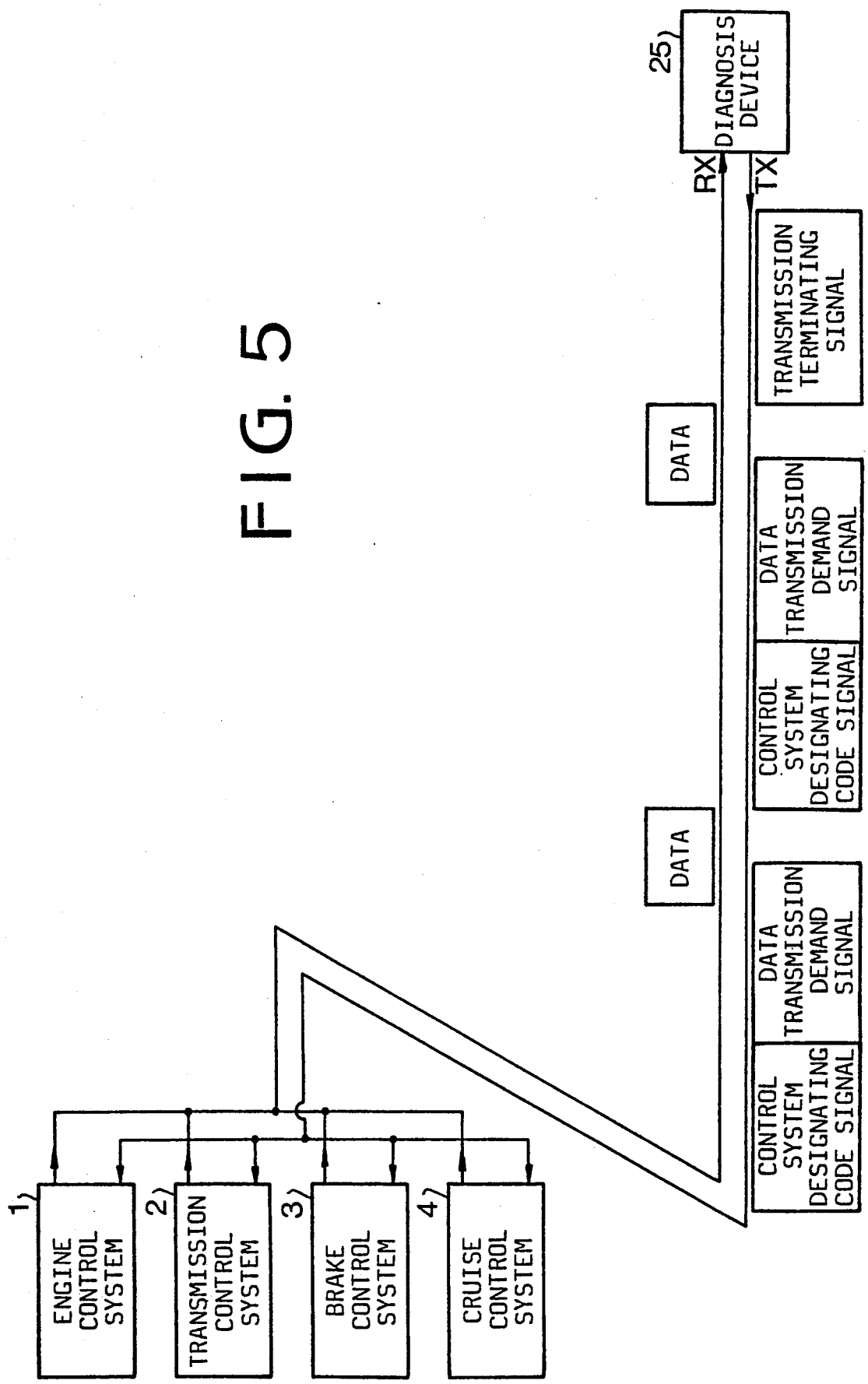

a diagnosis device, interpreting means provided in each electronic control system for interpreting a content of the received data demand signal, signal transmitting means provided in each electronic control system for transmitting an output signal to the diagnosis device in accordance with the interpretation through the interpreting means, a signal receiving line connecting all of the signal receiving means with each other in parallel, a signal transmitting line connecting all of the signal transmitting means with each other in parallel, and a connector connecting the signal receiving line and signal transmitting line with the diagnosis device.

The other objects and features of the present invention will become understood from the following description with reference to the accompanying drawings.

DIAGNOSIS SYSTEM FOR A MOTOR VEHICLE

BACKGROUND OF THE INVENTION

The present invention relates to a diagnosis system for a motor vehicle.

Recently, a motor vehicle was equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. Accordingly, if malfunctioning of the components and sensors occur, the engine does not properly operate.

However, because of complexity of the electronic control system, it is difficult to immediately recognize the trouble. Accordingly, a trouble diagnosis device for easily checking the electronic control system should be equipped in an auto shop. The electronic control system has a memory and a communication system to be connected to the trouble diagnosis device.

Japanese Utility Model Application Laid-Open 60-25974 discloses a diagnosis system in which a plurality of connectors are provided between various sensors and control circuits or between various actuators and control circuits. A plurality of decision circuits, holding means and displays are connected to the connectors for detecting an abnormality of the system. Since a plurality of connectors, decision circuits holding means and displays are provided, the system becomes complicated in structure.

Recently, a diagnosis system has been proposed, in which a bidirectional communication system is provided between the electronic control system and the trouble diagnosis device, thereby diagnosing data based on output signals from various sensors and control data for various actuators in the control system through a single diagnosis device.

However, in a motor vehicle, a plurality of electronic control systems for the engine, transmission, brake and cruise are provided. In order to diagnose trouble in these control systems, connectors for respective control systems must be connected to a connector of the diagnosis device, which is troublesome work. When a plurality of control systems are in trouble at one time, it is difficult to diagnose those troubles and it takes time to determine the trouble.

SUMMARY OF THE INVENTION

An object of the present invention is to provide a diagnosis system for a motor vehicle in which a trouble diagnosis device is connected to a plurality of electronic control systems provided in the motor vehicle through a single connector.

Another object of the present invention is to provide a diagnosis system in which diagnosis operations for a plurality of electronic control systems and a plurality of sensors in the systems can be accurately performed in a short time.

According to the present invention, there is provided a system for diagnosing electronic control systems mounted on a motor vehicle, comprising the electronic control system having an identification code representing a type of the vehicle, a diagnosis device, signal receiving means provided in each of the electronic control systems for receiving data demand signal from the

BRIEF DESCRIPTION OF DRAWINGS

FIG. 5 is a diagram showing a data communication procedure between the electronic control system and the diagnosis device.

DETAILED DESCRIPTION OF THE PREFERRED EMBODIMENT

Figure 1:
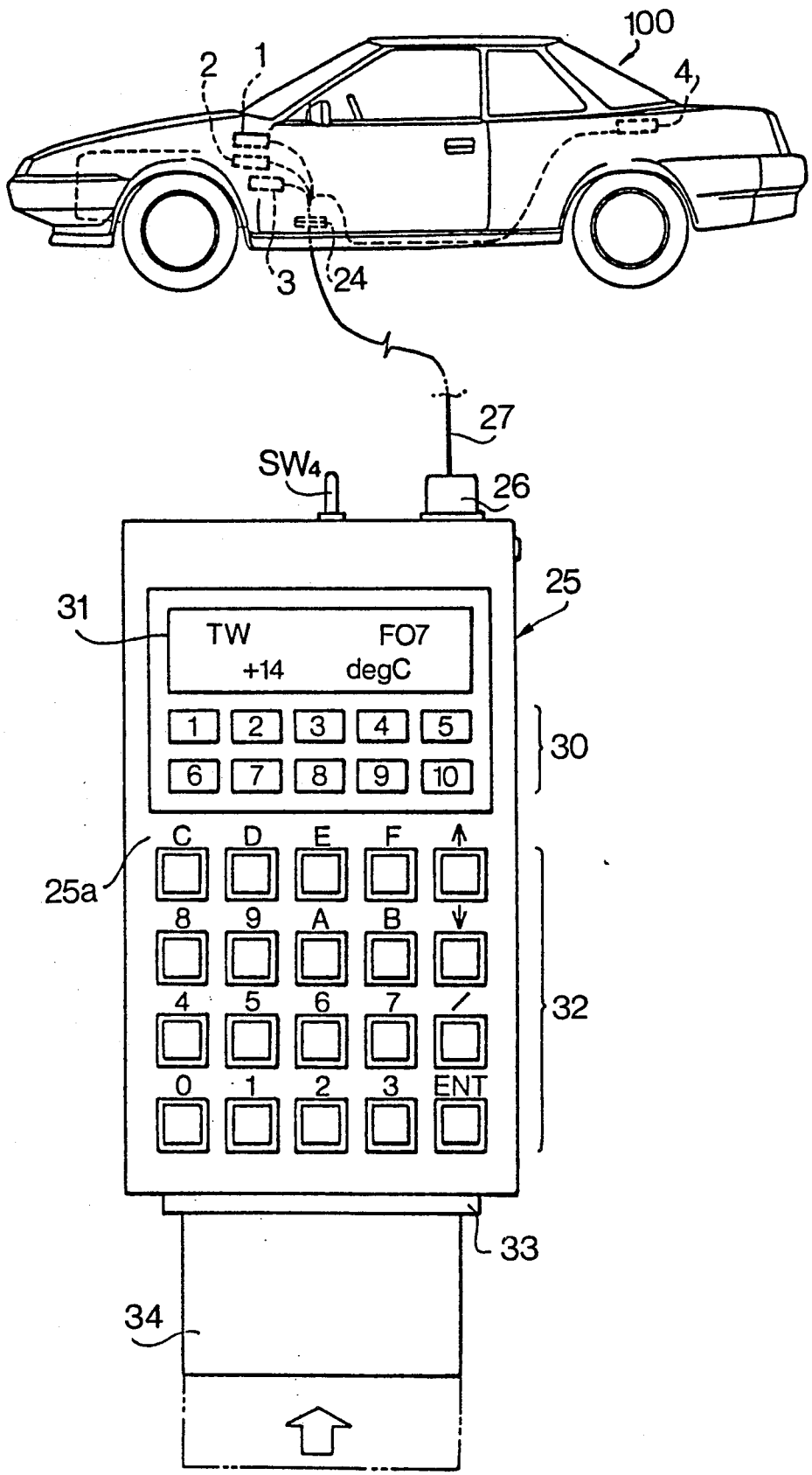
FIG. 1 is a schematic illustration of a diagnosis system according to the present invention.

Referring to FIG. 1, an automobile 100 is equipped with a plurality of electronic control systems for controlling various components of the automobile 100 such as an electronic engine control system 1 for controlling air-fuel ratio of the engine and others, an electronic transmission control system 2, an electronic brake control system 3 for controlling an antilock brake system, and an electronic cruise control system 4 for constant speed drive of the automobile. These electronic control systems are connected to an external connector 24. A portable diagnosis device 25 comprising a microcomputer is housed in a case 25a and has a connector 26, to which the connector 24 of the system 2 is connected trough an adapter harness 27.

The diagnosis device 25 has a power switch SW4, a liquid crystal display 31, an indicator section 30 consisting of a plurality of LED indicators and a keyboard 32. A connector 33 is provided for connecting a detachable memory cartridge 34.

Figure 2A:
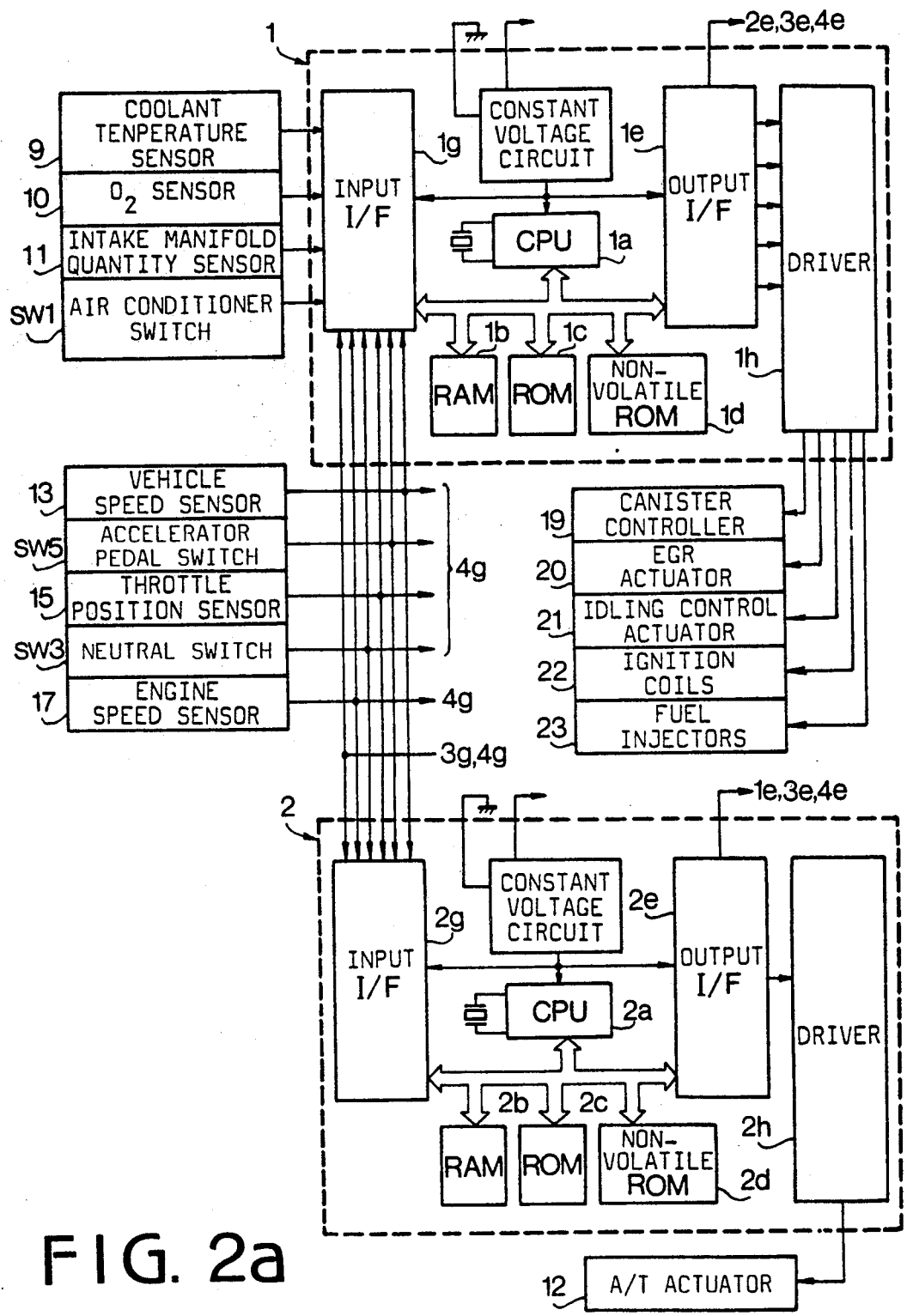
FIGS. 2a to 2c show a block diagram of the system.
Figure 2B:
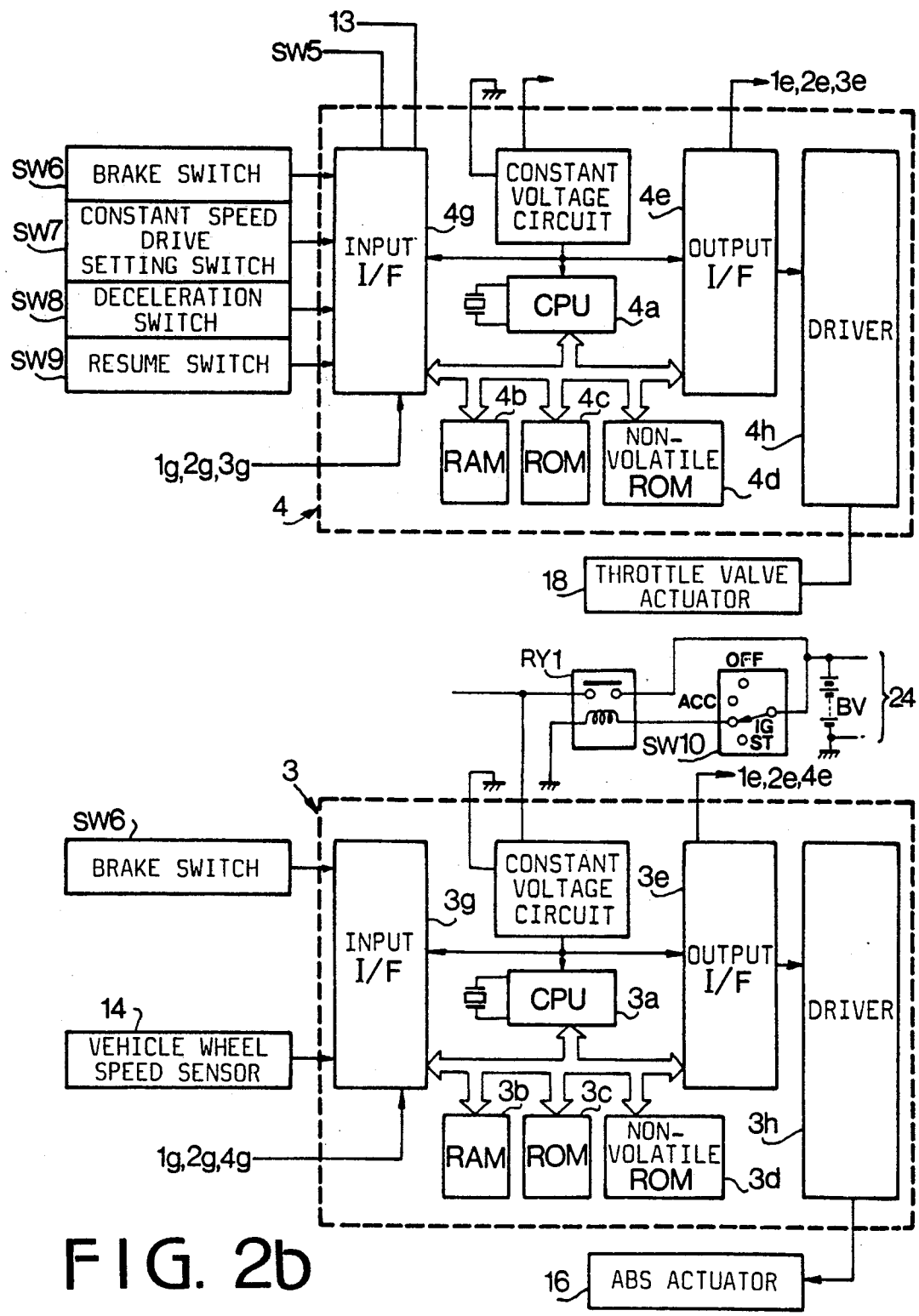
Figure 2C:
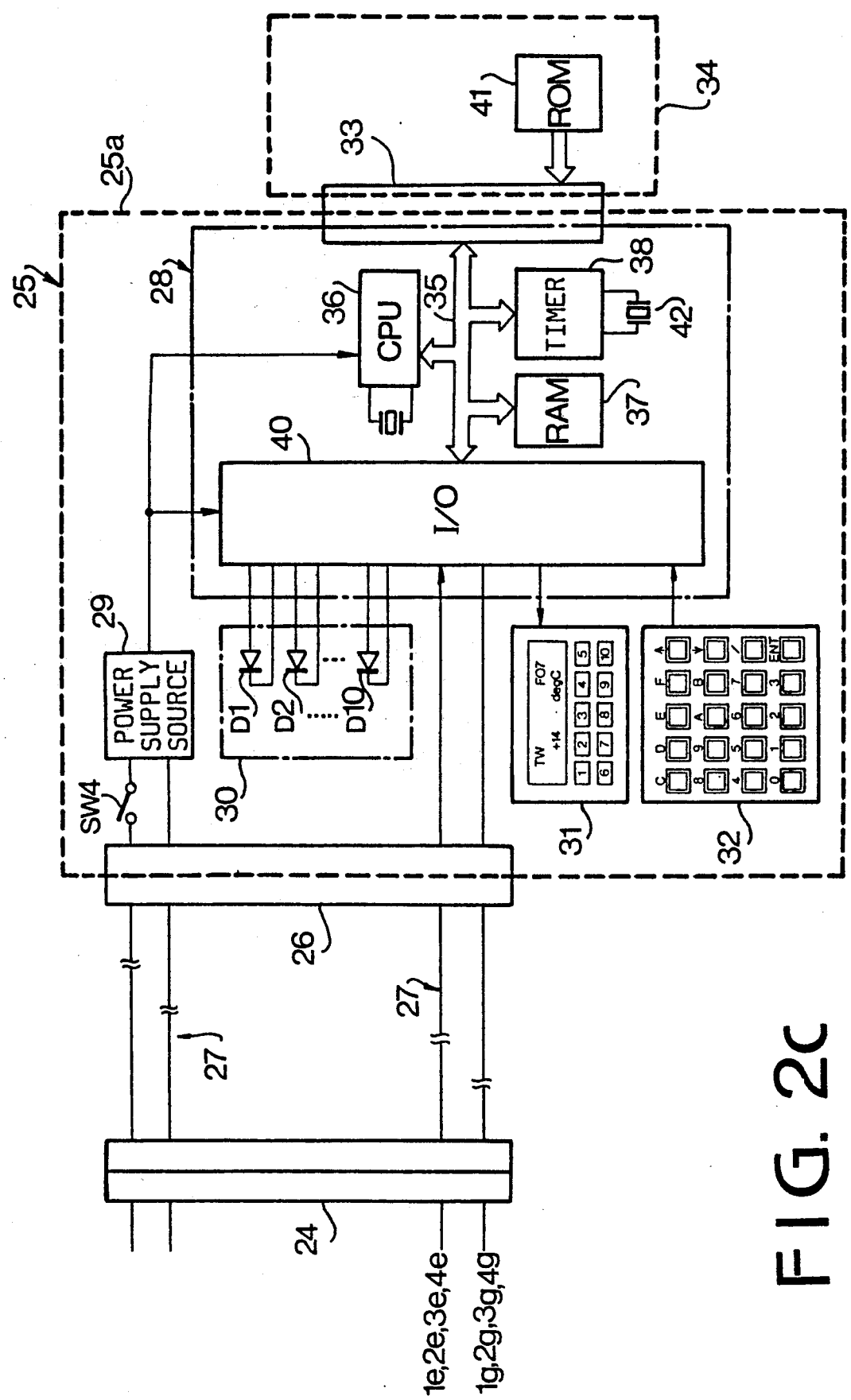

Referring to FIGS. 2a and 2b, the electronic control systems 1, 2, 3 and 4 have central processor units (CPUs) 1a, 2a, 3a and 4a, random access memories (RAMs) 1b, 2b, 3b and 4b, read only memories (ROMs) 1c, 2c, 3c and 4c, non-volatile random access memories (non-volatile RAMs) 1d, 2d, 3d and 4d, input interfaces 1g, 2g, 3g and 4g, and output interfaces 1e, 2e, 3e and 4e, respectively. These CPU, RAMs ROMs, input and output interfaces in each control system are connected to each other through a bus line. In the RAMs 1b to 4b, various processed parameters and tables are stored. Programs and data for controlling the engine and fixed data such as the type of the vehicle are stored in the ROMs 1c to 4c. Power is supplied to the CPUs, input and output interfaces, and drivers of the control systems from a source BV through a contact of a relay RY1 and constant voltage circuits. A coil of the relay RY1 is connected to the source BV through an ignition switch SW10.

The electronic engine control system receives signals from a coolant temperature sensor 9, an $O_2$ sensor 10, an intake manifold pressure sensor 11, an air conditioner switch SW1, a vehicle speed sensor 13, an accelerator pedal switch SW5, a throttle position sensor 15, a neutral switch SW3 and an engine speed sensor 17 through the input interface $1g$.

These signals are stored in the RAM $1b$ after the processing of data in accordance with the program stored in the ROM $1c$. The CPU $1a$ produces respective control signals, which are applied to a driver $1h$ through the output interface $1e$. The driver $1h$ produces signals for controlling a canister controller 19 of a fuel-vapor emission control system, an EGR (exhaust gas recirculation system) actuator 20, an idling control actuator 21, ignition coils 22 and fuel injectors 23.

The electronic transmission control system 2 receives signals from the engine speed sensor 17, vehicle speed sensor 13, accelerator pedal switch SW5, throttle position sensor 15 and neutral switch SW3 through the input interface $2g$. The CPU $2a$ produces a signal which is supplied to an A/T (automatic transmission) actuator 12 through the output interface $2e$ and a driver $2h$, for controlling the transmission in response to driving conditions.

The electronic brake control system 3 receives signals from a brake switch SW6 and a vehicle wheel speed sensor 14 through the input interface $3g$. These signals are processed in accordance with the program stored in the ROM$3c$ for controlling an antilock brake system. A control signal is applied to an ABS actuator 16 through the output interface $3e$ and a driver $3h$.

An electronic cruise control system 4 is supplied with signals from a constant speed drive setting switch SW7 and vehicle speed sensor 13 through the input interface $4g$. A control signal is supplied to a throttle valve actuator 18 through the output interface $4e$ and a driver $4h$ for controlling constant speed drive of the vehicle. When signals from the brake switch SW6, the accelerator pedal switch SW5, a deceleration switch SW8 and a resume switch SW9 are supplied to the input interface $4g$, release of the constant speed drive or decelerated constant speed drive are performed.

In these control systems 1, 2, 3 and 4, input interfaces $1g$ to $4g$ are connected to each other in parallel and output interfaces $1e$ to $4e$ are connected to each other in parallel so that bus lines comprising signal transmitting lines and signal receiving lines are formed.

The diagnosis device 25 has a control unit 28 and a power supply source 29. The control unit 28 comprises a CPU 36, a RAM 37, an input/output (I/O) interface 40, and a timer 38. These elements are connected to each other through a bus line 35. A clock pulse generator 42 is provided in the timer 38 for generating synchronizing pulses.

Inputs of the I/O interface 40 are connected to the output interface $1e$ to $4e$ of the control systems 1 to 4 through the connectors 24 and 26 and harness 27 so as to receive output signals of the sensors and switches. Outputs the interface 40 are connected to the indicator section 30. The indicator section 30 has a plurality of LEDs $D_1$ to $D_{10}$ which are operated in accordance with switches SW1, SW3, SW5 to SW9. When one of the switches is turned on, a corresponding LED of LEDs $D_1$ to $D_{10}$ is lighted or intermittently lighted, so that the operation of the switch can be confirmed. Inputs of the I/O interface 40 are connected to the keyboard 32 for receiving a mode select signal dependent on the operation of the keyboard, and to the output interfaces $1e$ to $4e$. Outputs of interface 40 are connected to the input interfaces $1g$ to $4g$ and the display 31. The power source 29 for supplying the power to the CPU 36 and I/O interface 40 is connected to the source BV through the power switch SW4.

The memory cartridge 34 selected for diagnosing the selected control system 2 is connected to the diagnosis device 25 through the connector 33. A ROM 41 provided in the memory cartridge 34 stores control programs for diagnosing the electronic control system of the vehicle and fixed data.

Figure 3A:
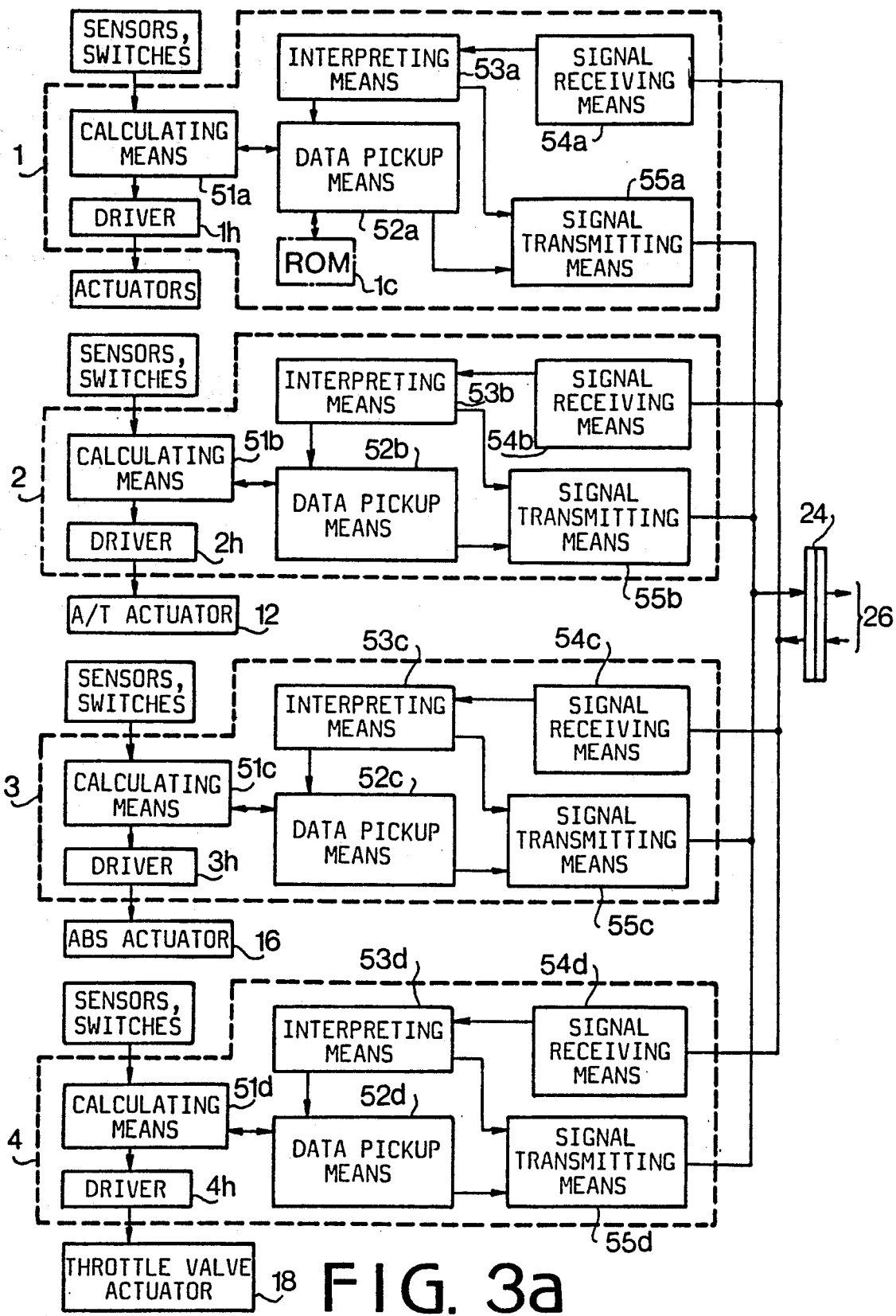
FIGS. 3a and 3b show a block diagram showing a main part of the system.
Figure 3B:
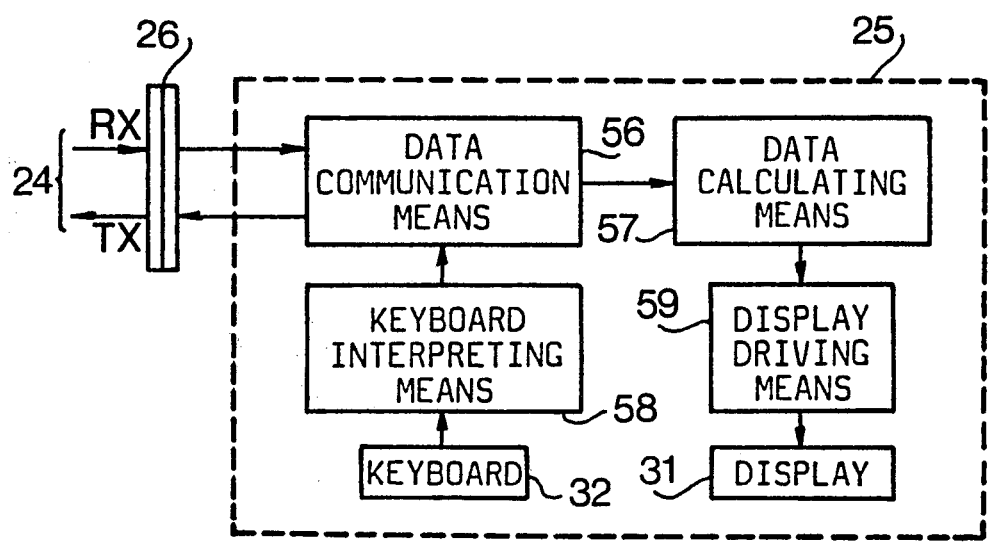

Referring to FIGS. 3a, 3b the electronic control systems 1 to 4 have calculating means $51a$ to $51d$ for calculating signals from the sensors and switches, and drivers $1h$ to $4h$ connected to the calculating means $51a$ to $51d$ for supplying actuating signals to respective actuators. Each of signal receiving means $54a$ to $54d$ is provided for receiving data demand signals from the diagnosis device 25. Interpreting means $53a$ to $53d$ are provided for interpreting the contents of data demand signals and producing pickup signals which are applied to data pickup means $52a$ to $52d$, respectively. In accordance with pickup signals, data pickup means $52a$ to $52d$ pick up data from data calculated in the means $51a$ to $51d$ or data stored in ROMs $1c$ to $4c$, and produce data signals, respectively. The data signals are supplied to the diagnosis device 25 through signal transmitting means $55a$ to $55d$ which are connected in parallel. Signal receiving means $54a$ to $54d$ are connected to each other in parallel. These signal receiving means and transmitting means are connected to the connector 24 through bus lines.

The control unit 28 of the diagnosis device 25 comprises a keyboard interpreting means 58 provided for interpreting a designated mode input by the keyboard 32. A data communication means 56 retrieves a designated range of the fixed control program corresponding to the designated mode in accordance with the mode signal from the keyboard interpreting means 58. In accordance with a diagnosis program stored in the designated range, the data communication means 56 produces a data demand signal TX which is applied to the control systems 1 to 4 and receives a data signal RX fed from the control systems. A data calculating means 57 calculates the data received at the data communication means 56 for converting the received binary digit into a decimal digit. A display driving means 59 produces a signal in accordance with the output of the data calculating means 57 for driving the display 31.

Figure 4A:
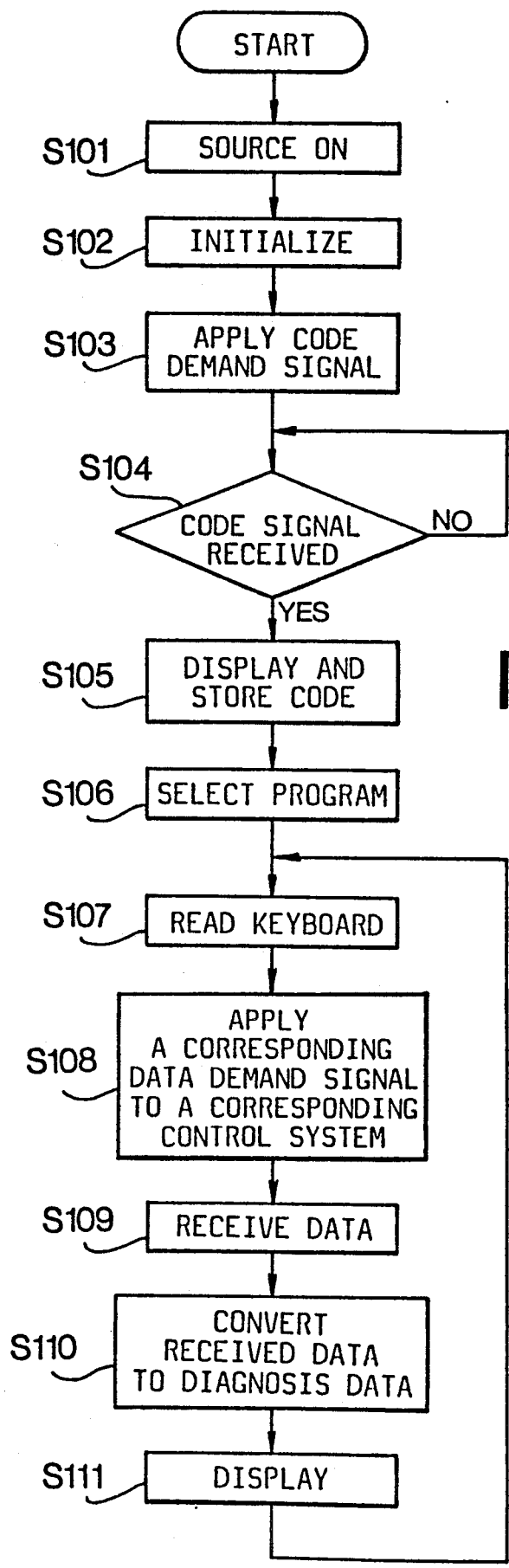
FIG. 4a is a flowchart showing an operation of a diagnosis device in the system.

The operation of the diagnosis system is described hereinafter with reference to the flowchart of FIGS. 4a and 4b. Referring to FIG. 4a, the diagnosis device 25 is connected to the electronic control system 2 through the connectors 24, 26 and harness 27. The engine is started, and the following diagnosis program is performed while the engine is running.

The power switch SW4 is turned on at a step S101. At a step S102, initialization of the control unit 28 is performed. At a step S103, a data demand signal TX from the data communication means 56 is applied to the engine control system 1. The data demand signals are previously stored in the ROM $1c$.

As shown in FIG. 5, the data demand signal TX comprises a control system designating code signal and a data transmission demand signal. First, the data demand signal TX provides a control system designating code signal for designating the control system, and second, provides a demand signal for demanding an identification code of the control system to the control system. The data demand signal is supplied from the diagnosis device 25 to the control systems 1 to 4 in the order of a control system designating code signal and a data transmission demand signal. That is, first an engine control system designating code signal is supplied and next the data transmission demand signal.

Figure 4B:
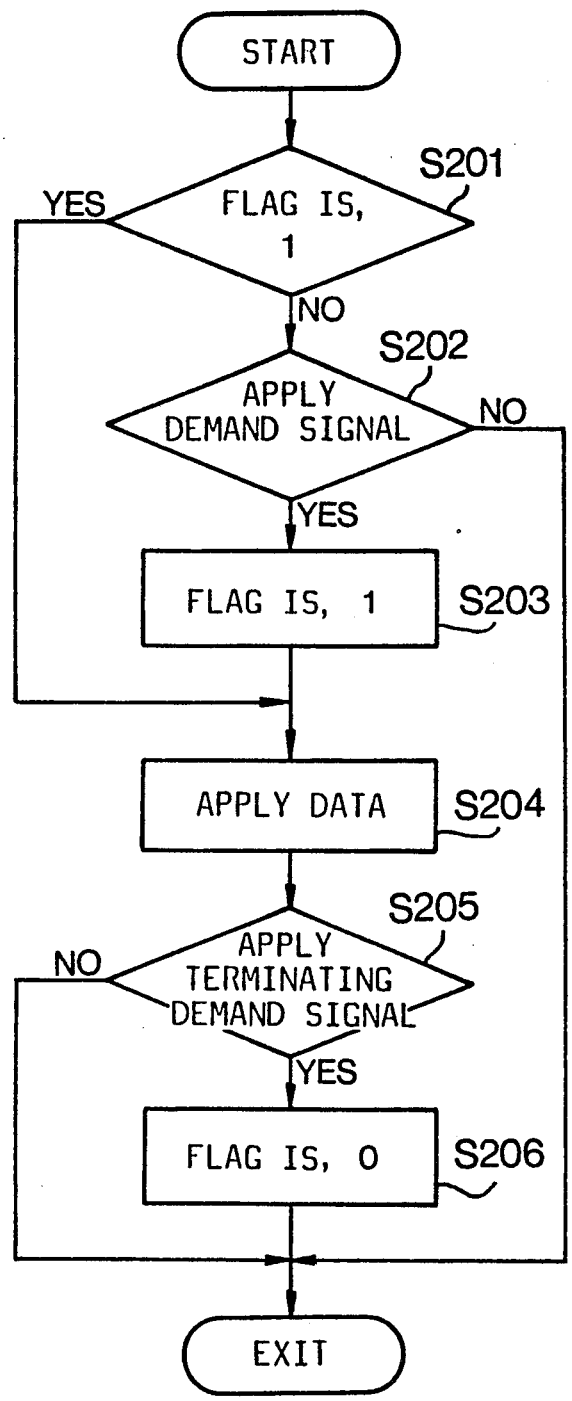
FIG. 4b is a flowchart showing an interrupt routine.

When the control system designating code signal is applied to control systems 1 to 4, actual operation in each system is interrupted and the program proceeds to a step S201 of an interrupt routine shown in FIG. 4b.

At step S201, it is determined whether a signal transmitting flag corresponding to the data transmission demand signal is "1" in each of the interpreting means 53a to 53d of the systems 1 to 4 or not. If the control system designating code signal is fed for the first time, the signal transmitting flag is "0". Thus, the program goes to a step S202 where each of the interpreting means 53a to 53d determines whether the control system designating code signal is applied to respective signal receiving means 54a to 54d or not. In this program, since the code of the engine control system 1 is designated, the program for the engine control system 1 proceeds to a step S203 and programs for the other control systems 2 to 4 proceed to an exit to terminate the interrupt routine.

At that time, since the signal transmitting flag in each of the other control systems 2 to 4 is "0", lines of the signal transmitting means 55b to 55d to the device 25 are opened.

At step S203, the signal transmitting flag of the engine control system 1 is set to "1", and a signal transmitting start signal is fed from the interpreting means 53a to the signal transmitting means 55a. Thus, the signal transmitting means is connected to the diagnosis device 25. The program goes to a step S204 where the interpreting means 53a supplies a signal to the data pickup means 52a to read out an identification code data from the data stored in the ROM 1c. The derived identification code data signal is fed from the signal transmitting means 55a to the diagnosis device 25.

At a step S205, it is determined whether the interpreting means 53a receives a signal demanding to terminate the signal transmission from the diagnosis device 25. When the termination of the signal transmission is determined, the program goes to a step S206 where the signal transmitting flag is set to "0" and a terminating signal is applied from the interpreting means 53a to the signal transmitting means 55a to open the transmission line to the diagnosis device 25. When the termination demand signal is not received, the interrupt routine terminates.

When the interrupt routine terminates, the main program is resumed. At a step S104, it is determined whether the identification code signal is applied to the control unit 28 or not. If the identification code signal is applied the program proceeds to a step S105. If not, the program of step S104 is repeated. At the step S105, a received code is stored in a predetermined address of the RAM 37. At a step S106, in accordance with the received code, a program for the type of the control system is selected from the ROM 41 in the cartridge 34. Thus, a diagnosis routine is performed in accordance with the program.

A diagnostician operates the keyboard 32 to perform the diagnosis of the engine control system 1. For example, in order to measure the coolant temperature, a mode code for the coolant temperature (for example F→0→7→ENT) is input by operating the keyboard 32 at a step S107. The input mode is read by the CPU 36 and temporarily stored in the RAM 37. Thereafter, the mode is read and interpreted in the keyboard interpreting means 58. A program according to a mode 07 representing a coolant temperature sensor output data program is read out. At a step 108, a corresponding data demand signal TX (for example, coolant temperature data in the engine control system 1) is applied to a corresponding control system from the data communication means 56 in such an order as FIG. 5.

In the control systems 1 to 4, the programs of interrupt routines are started. As described above, the signal transmitting flags in control systems 2 to 4 are "0", and the programs for the systems 2 to 4 go from step S201 to step S202 and to the exit.

On the other hand, the engine control system 1 is in the signal transmitting state for the identification code demand signal and the signal transmitting flag remains "1". Thus, the program goes from step S201 to step S204 where a data demand signal for coolant temperature is interpreted at the interpreting means 53a. The data demand signal for coolant temperature is applied to the data pickup means 52a. The data pickup means 52a interrupts the identification code pickup operation and operates to pick up coolant temperature data which is supplied to the diagnosis device 25 through the signal transmitting means 55a. At a step S109, a data signal RX representing coolant temperature is applied to the data communication means 56 from the engine control system 1. At a step S110, the received binary digit is converted into decimal digit representing the coolant temperature in the data calculating means 57.

The driving means 59 produces a calculated data which is applied to the display 31. At a step S111, a measured value of the coolant temperature, for example, +14 deg C. representing the temperature, an abbreviation mark TW of coolant temperature, and the input mode indication F07 are displayed on the display 31 as shown in FIG. 1. Thus, the diagnostician can diagnose the items about the coolant temperature.

In order to perform other diagnosis items, for example, to diagnose vehicle wheel speed data based on a signal from the vehicle wheel speed sensor 14 of the brake control system 3, the diagnostician operates the keyboard 32 to input a mode code for the vehicle wheel speed (for example F→B→1→ENT) (step S107). The input mode is read and interpreted at the keyboard interpreting means 58. At step S108, the corresponding data demand signal TX for the vehicle wheel speed is applied to the control systems 1 to 4 in the order of a brake control system designating code signal and a data transmission demand signal.

At that time, the engine control system 1 is under the condition for transmitting the coolant temperature data. Accordingly, when the interpreting means 53a of the control system 1 receives the data demand signal for the brake control system 3, the interpreting means 53a regards the data demand signal as a signal transmission terminating demand signal at a step S205. Thus, the program proceeds to a step S206 where the signal transmitting flag is set to "0". The interpreting means 53a produces a signal transmission terminating signal which is applied to the signal transmitting means 55a and the data pickup means 52a. The signal transmitting operation of the means 55a is terminated so that the line from the control system 1 to the diagnosis device 25 is opened. The data pickup means 52a terminates the pickup operation for the coolant temperature data.

Simultaneously, control systems 2 to 4 start the interrupt routine. The signal transmitting flags of the control systems 2 to 4 are "0" at step S201 and hence the programs go to step S202. Since the brake control system code is designated, the program of the brake control system 3 goes to step S203. The programs of the control systems 2 and 4 go to the exit to terminate the interrupt programs.

At step S203, the signal transmitting flag of the brake control system 3 is set to "1", and a signal transmitting start signal is fed from the interpreting means 53c to the signal transmitting means 55c. Thus, the signal transmitting means is connected to the diagnosis device 25. The program goes to a step S204 where the interpreting means 53c supplies a signal to the data pickup means 52c to read out the vehicle wheel speed data from the data stored in the RAM 3b. A derived wheel speed code data signal is fed from the signal transmitting means 55c to the diagnosis device 25.

At step S109, data signal RX representing the vehicle wheel speed is applied to the data communication means 56 from the control system 3. At step S110, the received binary digit is converted into the decimal digit representing the vehicle wheel speed in the data calculating means 57. At step S111, a calculated value of the vehicle wheel speed is displayed on the display 31.

Finally, when the switch SW4 is turned off, the signal transmission terminating demand signal is applied to control systems 1 to 4. The program of the brake controle system 3 goes from step S205 to step S206 where the signal transmitting flag is set to "0". A terminating signal is applied from the interpreting means 53c to the data pickup means 52c and the signal transmitting means 55c to terminate the signal transmitting operation of the brake control system 3.

In the present invention, diagnoses of a plurality of the electronic control systems 1 to 4 can be performed by connecting them to the diagnosis device 25 through the single external connector 24. For example, the vehicle speed data from the vehicle speed sensor 13, which is necessary for diagnosing the engine control system 1, transmission control system 2, and cruise control system 4, can be diagnosed by inputting a corresponding diagnosis mode through the keyboard 32. More particularly, if the vehicle speed data in all of the control systems 1, 2 and 4 are abnormal, it is diagnosed that the vehicle speed sensor 13 is in trouble. If the vehicle speed data in one of the control systems 1, 2 and 4 is abnormal, trouble such as a faulty contact of the connector or a short circuit in the control system and the sensor 13, breaking of wires, or mulfunction of that control system are assumed.

In accordance with the present invention, a plurality of electronic control systems provided in the automobile are connected to a diagnosis device through a single external connector. Diagnoses of a plurality of control systems are performed with a simple operation without changing the connector to another one. Thus, workability is improved and troubles in the control systems can be easily discovered. Since a single external connector is used, the number of parts and the manufacturing cost are reduced.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A diagnosis system for diagnosing a plurality of electronic control systems for a vehicle, each of said electronic control systems having sensing means for detecting operating conditions of the vehicle and control means for storing input data from said sensing means and providing output data for controlling the vehicle, said diagnosis system having a control unit responsive to said data for diagnosing said data and for providing diagnosis data, display means for display of said diagnosis data, and a keyboard for inputting a diagnosis mode into said control unit, the diagnosis system further comprising:

signal receiving means provided in each of the electronic control systems for receiving a data demand signal, representing a designated electronic control system, interpreted from said diagnosis mode, from the control unit and for producing a signal when said data demand signal designates the corresponding electronic control system;

interpreting means provided in each electronic control system for interpreting a content of the received data demand signal in response to said signal from said signal receiving means;

signal transmitting means provided in each electronic control system for transmitting an output signal to the diagnosis device in accordance with the interpretation through the interpretation means;

a signal receiving line connecting all of the signal receiving means with each other in parallel;

a signal transmitting line connecting all of the signal transmitting means with each other in parallel; and connecting means comprising a single male and female external connector connecting the signal receiving line and the signal transmitting line with the diagnosis device so as to continuously have diagnosis operations proceed without disconnecting said connecting means due to a difference of said input and output data.

2. The system according to claim 1, wherein the control unit includes a computer having a central processing unit and a memory, the memory having a plurality of diagnoses programs for diagnosing the electronic control systems, and said display means is for indicating results of diagnosis.

3. A diagnosis system for diagnosing a plurality of control systems for a vehicle, each of said control systems having sensing means for detecting operation conditions of the vehicle and control means responsive to input data from said sensing means for providing output data for controlling the vehicle.

said diagnosis system having a diagnosis device with a keyboard for inputting a diagnosis mode, a control unit responsive to said diagnosis mode for communicating with said control systems to provide diagnosis data of said control systems, display means for displaying said diagnosis data, a signal receiving line from said diagnosis device connecting each of said control systems in parallel, and a signal transmitting line from said diagnosis device connecting each of said control systems in parallel, said diagnosis system further comprising:

first interpreting means provided in said control unit for interpreting a designated control system and demanded data from said diagnosis mode;

communication means provided in said control unit for applying a control system designation signal representing said designated control system and a data demand signal representing said demanded data to all of said electronic control systems;

signal receiving means provided in each of said control systems for receiving said control system designation signal and said data demand signal and for producing a signal when said control system designation signal designates the corresponding control system;

second interpreting means provided in each of said control systems for interpreting a content of said data demand signal in response to said signal from said signal receiving means; and signal transmitting means provided in each of said control system for transmitting said diagnosis data corresponding to the content of said data demand signal to said diagnosis device.

4. The system according to claim 3, further comprising a couple of connectors provided on the signal receiving line and the signal transmitting line to operatively connect the diagnosis device with the control systems for readily performing the diagnosis.

5. The system according to claim 3, wherein
the diagnosis data represents the input data from the sensing means.

6. The system according to claim 3, wherein
the diagnosis data represents the output data from the control means.

7. The system according to claim 3, further comprising a memory provided in each of said control systems for storing the input data an the output data; and data pickup means provided in each of the control systems for picking up one of the input and output data stored in the memory in response to the content of the data demand signal interpreted by the second interpreting means and for applying said one of the input and output data to the signal transmitting means.

8. The system according to claim 3, wherein
the control unit includes a memory having a plurality of diagnosis programs and a central processing unit for diagnosing the control systems based on the diagnosis programs.

* * * * *